(12) United States Patent
Hirota et al.

(10) Patent No.: US 11,015,019 B2
(45) Date of Patent: May 25, 2021

(54) EPOXY RESIN, PRODUCTION METHOD, EPOXY RESIN COMPOSITION AND CURED PRODUCT OF SAME

(71) Applicant: DIC Corporation, Tokyo (JP)

(72) Inventors: Yousuke Hirota, Ichihara (JP); Shota Tanii, Kitaadachi-gun (JP); Koji Hayashi, Ichihara (JP); Kunihiro Morinaga, Ichihara (JP)

(73) Assignee: DIC Corporation, Tokyo (JP)

( * ) Notice: Subject to any disclaimer, the term of this patent is extended or adjusted under 35 U.S.C. 154(b) by 82 days.

(21) Appl. No.: 16/301,131

(22) PCT Filed: May 11, 2017

(86) PCT No.: PCT/JP2017/017801
§ 371 (c)(1),
(2) Date: Nov. 13, 2018

(87) PCT Pub. No.: WO2017/199831
PCT Pub. Date: Nov. 23, 2017

(65) Prior Publication Data
US 2019/0202974 A1    Jul. 4, 2019

(30) Foreign Application Priority Data
May 18, 2016 (JP) .............................. JP2016-099595

(51) Int. Cl.
| | | |
|---|---|---|
| C08G 59/24 | (2006.01) | |
| C08J 5/24 | (2006.01) | |
| H05K 3/46 | (2006.01) | |
| H01L 21/56 | (2006.01) | |
| H05K 1/03 | (2006.01) | |
| H01L 23/29 | (2006.01) | |
| C08G 59/06 | (2006.01) | |
| C08J 5/04 | (2006.01) | |
| C08J 5/18 | (2006.01) | |
| B32B 15/092 | (2006.01) | |
| B32B 15/20 | (2006.01) | |
| C08L 63/00 | (2006.01) | |
| C08L 63/04 | (2006.01) | |
| C09D 163/00 | (2006.01) | |
| C09D 163/04 | (2006.01) | |
| H05K 1/09 | (2006.01) | |

(52) U.S. Cl.
CPC .......... *C08G 59/245* (2013.01); *B32B 15/092* (2013.01); *B32B 15/20* (2013.01); *C08G 59/063* (2013.01); *C08G 59/24* (2013.01); *C08J 5/04* (2013.01); *C08J 5/18* (2013.01); *C08J 5/24* (2013.01); *C08L 63/00* (2013.01); *C08L 63/04* (2013.01); *C09D 163/00* (2013.01); *C09D 163/04* (2013.01); *H01L 21/565* (2013.01); *H01L 23/293* (2013.01); *H01L 23/295* (2013.01); *H05K 1/03* (2013.01); *H05K 1/0373* (2013.01); *H05K 1/09* (2013.01); *H05K 3/46* (2013.01); *B32B 2457/08* (2013.01); *C08J 2363/00* (2013.01); *C08J 2363/02* (2013.01); *C08J 2363/04* (2013.01); *C08J 2463/00* (2013.01)

(58) Field of Classification Search
CPC .......... C08G 59/245; C08G 59/24; C08J 5/24; C08J 5/04; C08J 5/18; C08J 2363/02; C08J 2363/00; C08J 2363/04; C08J 2463/00; C08L 63/00; C08L 63/04; B32B 15/092; B32B 15/20; B32B 2457/08; C09D 163/00; C09D 163/04; H01L 21/565; H01L 23/293; H01L 23/295; H05K 1/03; H05K 1/0373; H05K 1/09
See application file for complete search history.

(56) References Cited

U.S. PATENT DOCUMENTS 6,426,146 B1 * 7/2002 Ameen ................... C23C 26/00
205/197
2013/0101857 A1   4/2013 Arita et al.

FOREIGN PATENT DOCUMENTS

| CN | 102985485 A | 3/2013 |
| JP | H07-196770 A | 8/1995 |
| JP | 11-217422 A | 8/1999 |
| JP | 2000-007757 A | 1/2000 |
| JP | 2004-182752 A | 7/2004 |

(Continued)

OTHER PUBLICATIONS

International Search Reprot dated Jul. 25, 2017, issued for PCT/JP2017/017801.

(Continued)

*Primary Examiner* — Patrick D Niland
(74) *Attorney, Agent, or Firm* — Locke Lord LLP

(57) ABSTRACT

Provided are an epoxy resin including: an epoxidized product of monoalkyl dihydroxybenzene; and a compound that is detected in the molecular weight range from a molecular weight at the peak top of the epoxidized product of the monoalkyl dihydroxybenzene to the molecular weight at the peak top+20 to 40 and has a peak area % of 0.1% to 0.8% in a GPC chart, and an epoxy resin including an epoxidized product of monoalkyl catechol in which the ratio of the total content of a cyclic compound having a cyclic structure that has two adjacent oxygen atoms derived from the monoalkyl catechol as constituent atoms and a monoglycidyletherified product of the monoalkyl catechol to the content of a diglycidyletherified product of the monoalkyl catechol is in the range of 0.10 to 0.40 as measured by high performance liquid chromatography.

2 Claims, 3 Drawing Sheets

(56) References Cited

FOREIGN PATENT DOCUMENTS

| | | |
|---|---|---|
| JP | 2011-213869 A | 10/2011 |
| JP | 2012-131899 A | 7/2012 |
| JP | 2015-000952 A | 1/2015 |

OTHER PUBLICATIONS

Office Action dated Jun. 15, 2020, issued for Chinese patent application No. 201780030691.1.
Office Action dated Aug. 4, 2020, issued for the Taiwanese Patent Application No. 106115003.

* cited by examiner

[Fig.1]
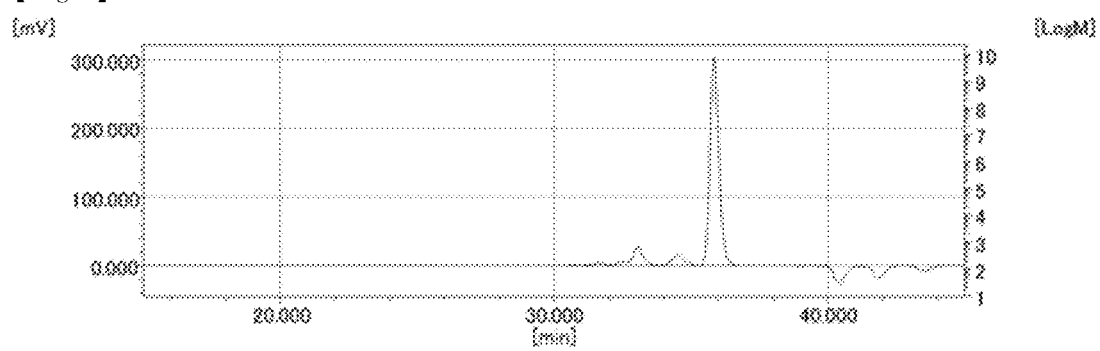
[Fig.2]
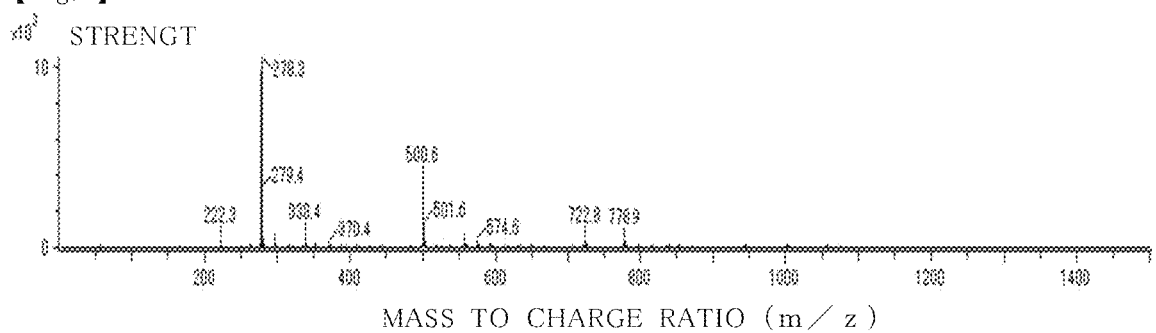
MASS TO CHARGE RATIO (m/z)
[Fig.3]
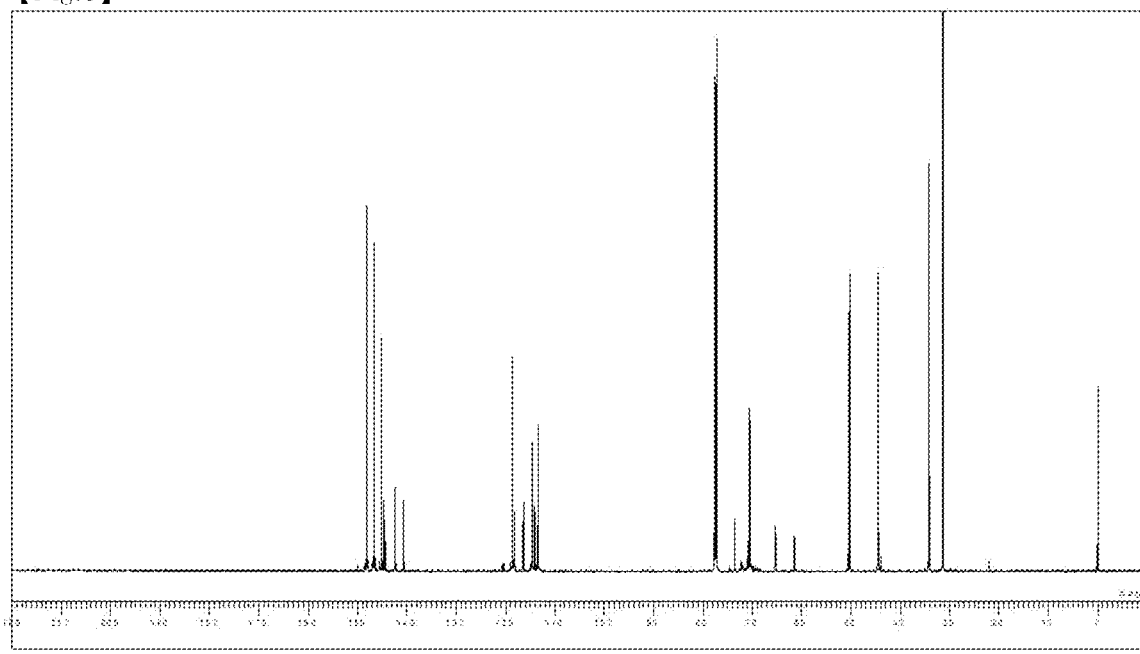

[Fig.4]
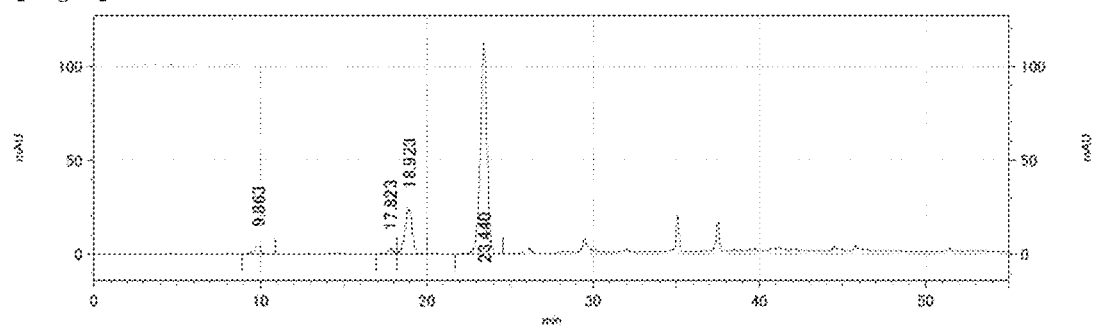
[Fig.5]
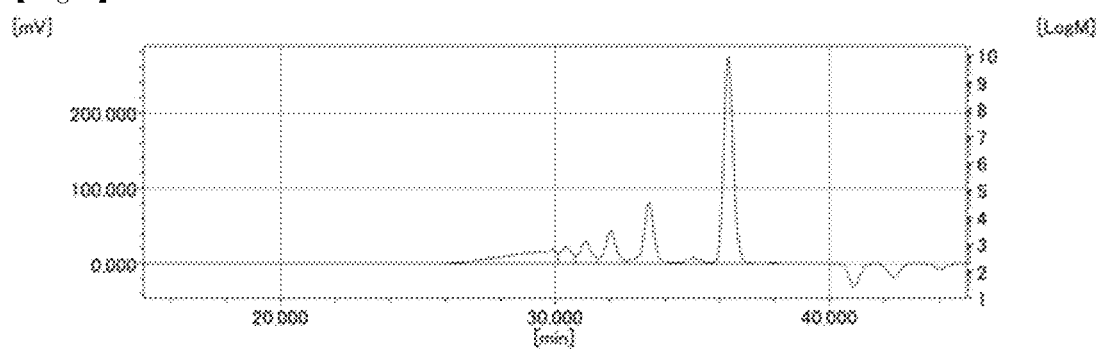
[Fig.6]
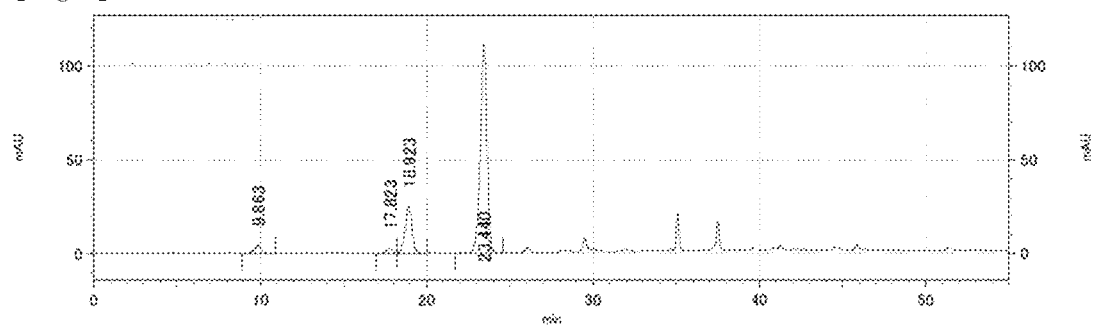
[Fig.7]
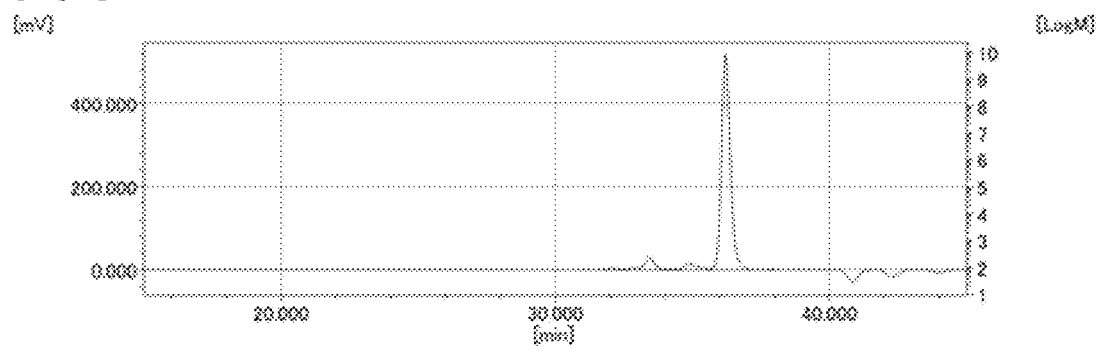

[Fig.8]
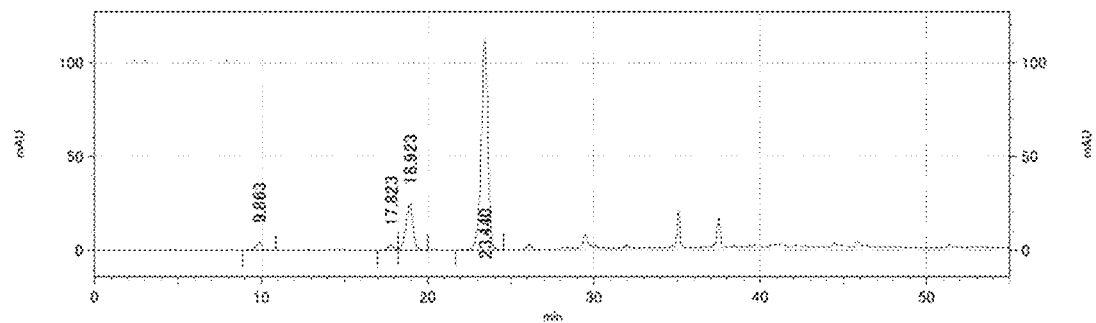
[Fig.9]
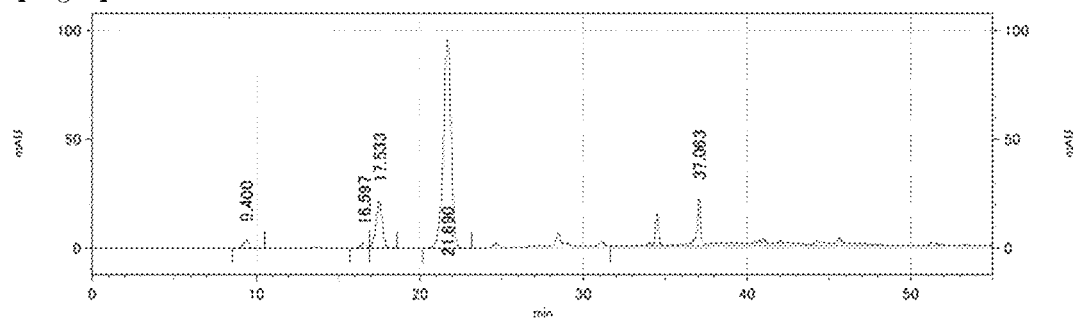
[Fig.10]
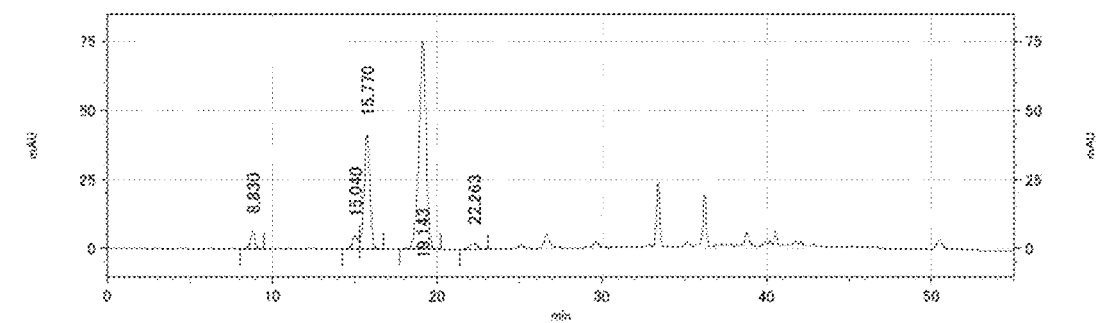
[Fig.11]
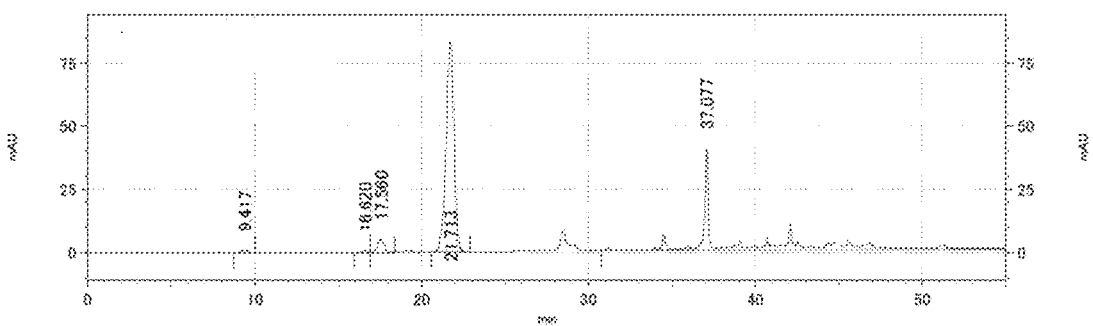

EPOXY RESIN, PRODUCTION METHOD, EPOXY RESIN COMPOSITION AND CURED PRODUCT OF SAME

TECHNICAL FIELD

The present invention relates to an epoxy resin that has an excellent balance between resin stability, high shrinkage during thermal curing, and hot elastic modulus, can form a cured product having favorable thermal resistance and mechanical property, and is suitable for use in semiconductor encapsulating materials and the like. The present invention also relates to a method of producing such an epoxy resin, an epoxy resin composition including such an epoxy resin, and a cured product thereof.

BACKGROUND ART

A curable resin composition which uses an epoxy resin and various curing agents has been widely used not only for an adhesive, a molding material, paint, a photoresist material, a developing material, and the like, but also in electric and electronic fields such as a semiconductor encapsulant and an insulating material for a printed wiring board, since a cured product to be obtained has excellent thermal resistance or is excellent in moisture resistance and the like.

Among these various applications, along with a trend towards miniaturization and weight reduction of an electronic device, a tendency towards high density according to narrowing of wiring pitch of a semiconductor device is remarkable. As a semiconductor mounting method to cope with this, a flip chip connection method for bonding a semiconductor device and a substrate, using a solder ball has been widely used. The flip chip connection method is a semiconductor mounting method by a so-called reflow method in which a solder ball is disposed between a wiring board and a semiconductor and the whole is heated and melted to be bonded. Therefore, there may be cases where at the time of reflowing, the wiring board itself is exposed to a high temperature environment, warpage occurs due to thermal shrinkage of the wiring board, a large stress is generated in the solder ball connecting the wiring board and the semiconductor, and connection failure of the wiring occurs. In order to suppress the warpage of the wiring board, a study to greatly shrink while improving hot elastic modulus of an encapsulant has been conducted, and even for a sealing resin, higher hot elastic modulus and higher shrinkage are required. Further, as a physical property after curing, demands for the sealing resin, such as thermal resistance and mechanical strength, increase year by year.

As an epoxy resin that can be suitably used as a semiconductor encapsulant, an epoxy resin having an allyl group as a substituent on the aromatic ring of a bisphenol skeleton has been provided (for example, see PTL 1).

When such an epoxy resin is used as a main agent of a curable resin composition, a certain effect can be obtained for the fluidity of the composition or the strength of a cured product, as compared with a case of using a general bisphenol epoxy resin. In such a case, however, the level of balance between mold shrinkage during thermal curing, hot elastic modulus, and the physical property of the cured product in the resin composition is not as satisfactory as required in recent years, and further improvement is required.

CITATION LIST

Patent Literature

PTL 1: JP-A-2015-000952

SUMMARY OF INVENTION

Technical Problem

Accordingly, an object to be achieved by the present invention is to provide an epoxy resin that can form a composition having an excellent balance between mold shrinkage during thermal curing and hot elastic modulus; a composition including such an epoxy resin; a method for production thereof; and a cured product thereof having favorable thermal resistance and mechanical strength.

Solution to Problem

As a result of intensive studies to achieve the object, the present inventors have found that the above problem can be solved by adjusting the content of a subcomponent in an epoxy resin including, as a main component, an epoxidized product of monoalkyl dihydroxybenzene that has an alkyl group having 4 to 8 carbon atoms as a substituent on an aromatic ring and by using the epoxy resin as a component of a curable composition, and thus have completed the present invention.

Specifically, the present invention is to provide an epoxy resin including: an epoxidized product of monoalkyl dihydroxybenzene having an alkyl group having 4 to 8 carbon atoms as a substituent on an aromatic ring, as a main component; and a compound ($\alpha$) that is detected in the molecular weight range from a molecular weight at a peak top of the epoxidized product of the monoalkyl dihydroxybenzene to the molecular weight at the peak top+20 to 40 and has a peak area % of 0.1% to 0.8% in a GPC chart of the epoxy resin.

Further, the present invention is to provide an epoxy resin including an epoxidized product of monoalkyl catechol that has an alkyl group having 4 to 8 carbon atoms as a substituent on an aromatic ring, as a main component, the epoxy resin having a $(\beta 1+\beta 2)/(\gamma)$ ratio of the total content of a cyclic compound ($\beta 1$) having a cyclic structure that has two adjacent oxygen atoms derived from the monoalkyl catechol as constituent atoms and a monoglycidyletherified product ($\beta 2$) of the monoalkyl catechol to the content of a diglycidyletherified product ($\gamma$) of the monoalkyl catechol in the range of 0.10 to 0.40 as measured by high performance liquid chromatography. The present invention is also to provide a method of producing the epoxy resin, an epoxy resin composition including the epoxy resin, and a cured product thereof.

Advantageous Effects of Invention

According to the present invention, it is possible to provide an epoxy resin that can form a resin composition having an excellent balance between mold shrinkage during thermal curing and hot elastic modulus, also can form a cured product with favorable thermal resistance and mechanical strength, and is suitable for use in semiconductor encapsulating materials and the like, According to the present invention, it is also possible to provide a method of producing such an epoxy resin, an epoxy resin composition, a cured product having the above properties, a semiconductor encapsulating material, a semiconductor device, prepreg, a circuit board, a buildup film, a buildup substrate, a fiber-reinforced composite material, and a fiber-reinforced molded article.

BRIEF DESCRIPTION OF DRAWINGS

FIG. 1 is a GPC chart of an epoxy resin (A-1) synthesized in Synthesis Example 1.
FIG. 2 is a FD-MS spectrum of the epoxy resin (A-1) synthesized in Synthesis Example 1.
FIG. 3 is a $^{13}$C-NMR spectrum of the epoxy resin (A-1) synthesized in Synthesis Example 1.
FIG. 4 is an HPLC chart of the epoxy resin (A-1) synthesized in Synthesis Example 1.
FIG. 5 is a GPC chart of an epoxy resin (A-2) synthesized in Synthesis Example 2.
FIG. 6 is an HPLC chart of the epoxy resin (A-2) synthesized in Synthesis Example 2.
FIG. 7 is a GPC chart of an epoxy resin (A-3) synthesized in Synthesis Example 3.
FIG. 8 is an HPLC chart of the epoxy resin (A-3) synthesized in Synthesis Example 3.
FIG. 9 is an HPLC chart of an epoxy resin (A-4) synthesized in Synthesis Example 4.
FIG. 10 is an HPLC chart of an epoxy resin (A'-1) synthesized in Comparative Synthesis Example 1.
FIG. 11 is an HPLC chart of an epoxy resin (A'-2) synthesized in Comparative Synthesis Example 2.

DESCRIPTION OF EMBODIMENTS

<Epoxy Resin>
Hereinafter, the present invention will be described in detail.

An epoxy resin according to the present invention is a product produced using, as a raw material, monoalkyl dihydroxybenzene that has an alkyl group having 4 to 8 carbon atoms as a substituent on an aromatic ring. The epoxy resin contains a compound (α) that is detected in the molecular weight range from a molecular weight at a peak top of the epoxidized product of the monoalkyl dihydroxybenzene to the molecular weight at the peak top+20 to 40 and has a peak area % of 0.1 to 0.8% in a GPC chart of the epoxy resin.

In a case where a content ratio of the compound (α) in the epoxy resin is less than 0.1% in terms of area %, a bulky structure in the resin is insufficient. Therefore, it is difficult to take a balance of the mold shrinkage during thermal curing and hot elastic modulus. When the content exceeds 0.8% by mass, a crosslinking density decreases and the hot elastic modulus tends to decrease.

It is considered that when including an alkyl group having 4 to 8 carbon atoms as a substituent on an aromatic ring in this manner, due to bulkiness thereof, the crosslinking density during a curing reaction is appropriately adjusted to be excellent in the balance of mold shrinkage during thermal curing and hot elastic modulus. In particular, from a viewpoint that the curing reaction proceeds favorably when obtaining a cured product using a curing agent as described later and from a viewpoint that it is easy to set the crosslinking density of the cured product to be in more an appropriate range, an alkyl group having a branched structure such as a t-butyl group, a t-octyl group is preferable, and in particular, the t-butyl group is most preferable.

In addition, a GPC area ratio of the compound (α) in the epoxy resin of the present invention is more preferably in a range of 0.2 to 0.5% from a viewpoint of more excellent balance of mold shrinkage during thermal curing and hot elastic modulus.

In addition, an epoxy equivalent of the epoxy resin of the present invention is preferably in a range of 170 to 400 g/eq, from a viewpoint of more improving the balance of mold shrinkage during thermal curing and hot elastic modulus. Further, in a case where the substituent on the aromatic ring is a butyl group, it is more preferable that the range is 170 g/eq to 250 g/eq.

In addition, in the epoxy resin of the present invention, in a case where the substituent on the aromatic ring is a butyl group, from a viewpoint of a mechanical strength of the cured product, it is preferable to be in a range of 300 to 2500 MPa·s at 25° C. Also, a viscosity in the present invention is a value measured in accordance with JIS K7233 single cylinder rotational viscometer method.

The content ratio of the compound (α) in the present invention is a value which is calculated by GPC measurement under the following conditions, and is calculated from an existence ratio of a peak area of the compound (α) to the total peak area of the epoxy resin.

<GPC Measurement Conditions>
Measurement device: "HLC-8320 GPC" manufactured by TOSOH CORPORATION
Column: Guard column "HXL-L" manufactured by TOSOH CORPORATION
+"TSK-GEL G2000HXL" manufactured by TOSOH CORPORATION
+"TSK-GEL G2000HXL" manufactured by TOSOH CORPORATION
+"TSK-GEL G3000HXL" manufactured by TOSOH CORPORATION
+"TSK-GEL G4000HXL" manufactured by TOSOH CORPORATION
Detector: RI (refractive index detector)
Data processing: "GPC workstation EcoSEC-WorkStation" manufactured by TOSOH CORPORATION
Measurement condition: column temperature 40° C.
Development solvent Tetrahydrofuran
Flow rate 1.0 ml/min
Standard: the following monodisperse polystyrene of which a molecular weight is known was used in accordance with the measurement manual of "GPC workstation EcoSEC-WorkStation".
(Polystyrene Used)
"A-500" manufactured by TOSOH CORPORATION
"A-1000" manufactured by TOSOH CORPORATION
"A-2500" manufactured by TOSOH CORPORATION
"A-5000" manufactured by TOSOH CORPORATION
"F-1" manufactured by TOSOH CORPORATION
"F-2" manufactured by TOSOH CORPORATION
"F-4" manufactured by TOSOH CORPORATION
"F-10" manufactured by TOSOH CORPORATION
"F-20" manufactured by TOSOH CORPORATION
"F-40" manufactured by TOSOH CORPORATION
"F-80" manufactured by TOSOH CORPORATION
"F-128" manufactured by TOSOH CORPORATION
Sample: obtained by filtering a tetrahydrofuran solution of 1.0% by mass in terms of solid resin content, with a microfilter (50 μl).

Examples of the compound (α) include a subcomponent included in a raw material and a subcomponent formed in a production process in a production method of the epoxy resin which will be described later, that include a compound represented by the following Structural Formula singly or in plural. The subcomponent may be included as it is in a prescribed amount without taking out from a system. A compound thereof may be synthesized in advance, isolated, and mixed with the epoxidized product of monoalkyl dihydroxybenzene to be in a prescribed amount to obtain the epoxy resin of the present invention.

[Chem. 1]

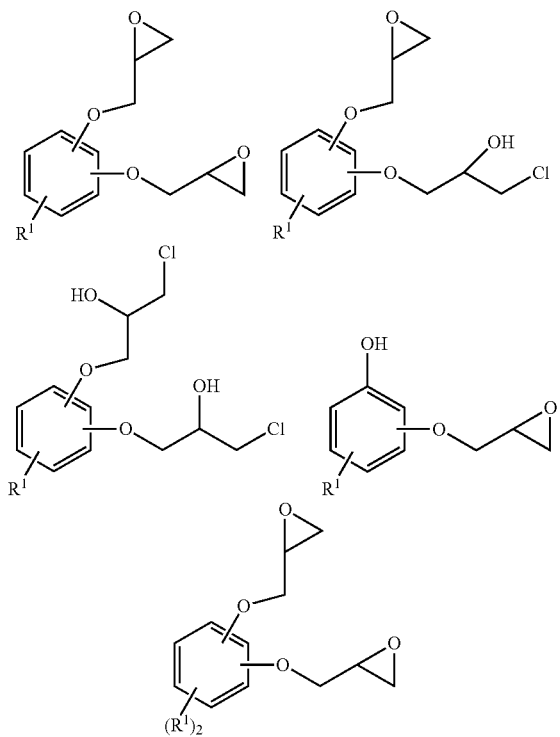

(In Formula, $R^1$ is an alkyl group having 4 to 8 carbon atoms.)

An existence position of the two hydroxy groups in raw material monoalkyl dihydroxybenzene of the epoxy resin of the present invention is not particularly limited. That is, any of catechol, resorcin, and hydroquinone which have an alkyl group having 4 to 8 carbon atoms as a substituent on an aromatic ring may be used. However, from a viewpoint of more excellent curability and excellent balance of thermal resistance and mechanical properties of a cured product, it is preferable to use monoalkyl catechol.

The epoxy resin according to the present invention is preferably an epoxy resin including: an epoxidized product of monoalkyl catechol that has one alkyl group having 4 to 8 carbon atoms as a substituent on an aromatic ring, as a main component; and a compound (α) that is detected in the molecular weight range from a molecular weight at the peak top of the epoxidized product of the monoalkyl dihydroxybenzene to the molecular weight at the peak top+20 to 40 and has a peak area % of 0.1 to 0.8% in a GPC chart of the epoxy resin. The epoxy resin according to the present invention is also preferably an epoxy resin having a (β1+β2)/(γ) ratio of the total content of a cyclic compound (β1) having a cyclic structure that has two adjacent oxygen atoms derived from monoalkyl catechol as constituent atoms and a monoglycidyletherified product (β2) of monoalkyl catechol to the content of a diglycidyletherified product (γ) of monoalkyl catechol in the range of 0.10 to 0.40 as measured by high performance liquid chromatography.

A representative structure of the cyclic compound (β1) having a cyclic structure that has two adjacent oxygen atoms derived from the monoalkyl catechol as constituent atoms is presumed as follows.

[Chem. 2]

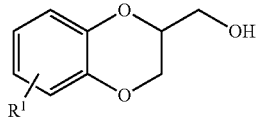

(In Formula, $R^1$ is an alkyl group having 4 to 8 carbon atoms.)

When including such a cyclic compound (β1) in a certain amount, due to a bulky structure, it is possible to express the high shrinkage during thermal curing and hot elastic modulus in a good balance. Further, it is convenient to make the viscosity of the epoxy resin within an appropriate range, for example, an effect of improving impregnating property when impregnating reinforcing fiber is exhibited.

Further, when including such a cyclic compound (β1), also in a cured product, elastic modulus thereof improves, mechanical strength thereof is excellent, and the cured product can be suitably used for a molding material application.

However, since the cyclic compound (β1) does not have an epoxy group, it is not completely incorporated into a three-dimensional crosslinked structure in the cured product. Therefore, when a content thereof increases, it may become a volatile component while preserving epoxy resin. Therefore, it is indispensable to exist within a certain range.

That is, a ratio of a total content of a cyclic compound (β1) having a cyclic structure that has two adjacent oxygen atoms derived from monoalkyl catechol as constituent atoms and a monoglycidyletherified product (β2) of monoalkyl catechol to a content of a diglycidyletherified product (γ) of monoalkyl catechol preferably satisfies a range of (β1+β2)/(γ)=(0.10 to 0.40), in high performance liquid chromatography. In particular, the ratio is more preferably in a range of 0.10 to 0.30 from the viewpoint of having both the impregnating property to carbon fibers and the like accompanying the reduction in the viscosity of the resin and the volatility of the resin, and the ratio is further preferably 0.10 to 0.25 from the viewpoint of maintaining the thermal resistance.

The structure of the monoglycidyletherified product (β2) of the monoalkyl catechol is as shown below.

[Chem. 3]

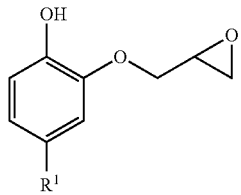

(In Formula, $R^1$ is an alkyl group having 4 to 8 carbon atoms.)

In the present invention, a ratio of the total content of a compound of the monoglycidyletherified product (β2) of monoalkyl catechol to a content of the diglycidyletherified product (γ) of monoalkyl catechol is a value obtained by HPLC measurement under the following conditions.

<HPLC Measurement Conditions>
"Agilent 1220 Infinity LC" manufactured by TOSOH CORPORATION
Column: "TSK-GEL ODS-120T" manufactured by TOSOH CORPORATION
Detector: VWD
Data processing: "Agilent EZChrom Elite" manufactured by TOSOH CORPORATION
Measurement condition: column temperature 40° C.
Development solvent
A solution: water/acetonitrile=50/50 wt %
B solution: acetonitrile
Development condition A solution/B solution=95/5 (15 min)
Linear gradient (20 min)
Solution A/Solution B=0/100 (20 min)
Flow rate 1.0 ml/min
Measurement wavelength 254 nm In addition, as the epoxy resin of the present invention, from a viewpoint of increasing the mold shrinkage of the cured product, an epoxy resin represented by Structural Formula (1) is preferable.

[Chem. 4]

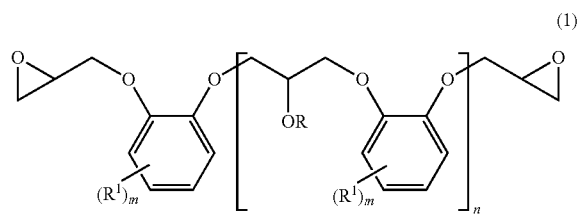

(1)

[In Structural Formula (1), $R^1$ represents an alkyl group having 4 to 8 carbon atoms, R represents a hydrogen atom or a glycidyl group, m is 1 or 2, a proportion of m=1 is 99% or more. n represents a repeating number and is an average value of 0.01 to 10, and R, $R^1$, and m may be the same or different from each other for each repetition.]

As described above, from the viewpoint of mold shrinkage, $R^1$ in Structural Formula (1) is more preferably a butyl group or an octyl group, and most preferably a t-butyl group.

In addition, from viewpoints of more excellent balance of mold shrinkage during thermal curing and hot elastic modulus, industrial availability of raw materials, and mechanical strength of the cured product, R is preferably a hydrogen atom.

In addition, n in General Formula (1) is an average of the number of repetitions, and is more preferably in a range of 0.01 to 3 from the viewpoint of compatibility of hot elastic modulus and thermal stability.

<Production Method of Epoxy Resin>

As described above, the epoxy resin of the present invention includes the compound (α) or (β1) and (β2) in a specific amount. As a method of obtaining such an epoxy resin (A), an epoxidized product of monoalkyl dihydroxybenzene that has an alkyl group having 4 to 8 carbon atoms as a substituent on an aromatic ring and the compound (α) or (β1) and (β2) are prepared in advance, these are mixed so as to have a specific ratio, and the epoxy resin can be obtained. Further, it may be a method in which monoalkyl dihydroxybenzene of a raw material and dialkyl dihydroxybenzene or the like are mixed in advance and then these are epoxidized.

When using the latter production method, industrial productivity is excellent and it is easy to make the epoxy resin to be obtained more excellent in uniformity.

Examples of the monoalkyl dihydroxybenzene include n-butyl hydroquinone, n-butyl resorcinol, n-butyl catechol, sec-butyl hydroquinone, sec-butyl resorcinol, sec-butyl catechol, t-butyl hydroquinone, t-butyl resorcinol, t-butyl catechol, n-hexyl hydroquinone, n-hexyl resorcinol, and 4-octyl catechol. Examples of the dialkyl dihydroxybenzene include 3,5-di-t-butyl catechol and 2,5-di-t-butyl hydroquinone. Theses may be used alone or two or more thereof may be used in combination. Among these, from the viewpoint of mold shrinkage of the epoxy resin to be obtained, it is preferable to have an alkyl group having a bulkier structure and be adjacent to a hydroxyl group. Further, from viewpoints of availability of raw materials and properties during curing of the epoxy resin composition to be obtained, it is most preferable to use t-butyl catechol and 3,5-di-t-butyl catechol.

The production method of an epoxy resin of the present invention is a production method of an epoxy resin in which monoalkyl dihydroxybenzene of a raw material and dialkyl dihydroxybenzene are mixed in advance in a range of 99.1/0.9 to 99.9/0.1 (monoalkyl dihydroxybenzene/dialkyl dihydroxybenzene) as described above and are reacted with epihalohydrin to be epoxidized.

At this time, examples thereof include a method in which 1 to 10 mol of the epihalohydrin is added to 1 mol of hydroxyl group included in a raw material, then, 0 to 5.0 mol % of a phase transfer catalyst is added to 1 mol of hydroxyl group included in the raw material and dissolved, further, reacted for 0.5 to 10 hours at a temperature of 20 to 120° C., while adding 0.9 to 2.0 mol of a basic catalyst at once or gradually to 1 mol of raw material of hydroxybenzenes. The basic catalyst may be used in a state of solid or in a state of an aqueous solution thereof. In a case where the aqueous solution is used, a method in which the aqueous solution is continuously added and water and epihalohydrins are continuously extracted from a reaction mixture under reduced pressure or atmospheric pressure to further separate the liquid, thereby removing water and continuously returning the epihalohydrins into the reaction mixture may be used. In addition, from the viewpoint of easily including the cyclic compound (β1) having a cyclic structure that has two adjacent oxygen atoms derived from monoalkyl catechol as constituent atoms and the monoglycidyletherified product (β2) of monoalkyl catechol, in a specific amount, first, as a first step, reaction is performed for 1 to 50 hours at a temperature of 50 to 80° C. while adding 0.1 to 0.9 mol of a basic catalyst at once or gradually to 1 mol of hydroxyl group included in the raw material. Then, as a second step, it is preferable to produce under conditions of performing a reaction for 0.5 to 8 hours at a temperature of 50 to 100° C. while adding the basic catalyst in a total amount of 1.0 to 2.0 mol to 1 mol of hydroxyl group at once or gradually.

In particular, in a case of using monoalkyl catechol that has an alkyl group having 4 to 8 carbon atoms as a substituent on the aromatic ring as a raw material, when setting the temperature of the first step to a range of 50 to 80° C., a ring closure reaction is appropriately performed and it is easy to adjust a content ratio of the cyclic compound (β1). In a case where the cyclic compound (β1) is small, the viscosity of the epoxy resin to be obtained tends to increase. On the other hand, in a case where the content ratio of the cyclic compound (β1) is high, the volatility increases and toughness of the cured product decreases. In addition, when the time of the first step is too short, addition of epichlorohydrin does not proceed sufficiently, monoglycidyletherified product and the cyclic compound tend to be formed in a large amount. On the other hand, when the time is too long, an epoxy group is formed in a large amount and the viscosity tends to increase.

When performing industrial production, all of the epihalohydrins used for charging are new in a first batch of an epoxy resin production. However, in subsequent batches, it is preferable to use the epihalohydrins recovered from a crude reaction product and new epihalohydrins corresponding to the amount consumed and disappeared in the reaction in combination. In this case, impurities induced by the reaction of epichlorohydrin such as glycidol or the like with water, an organic solvent, or the like may be included. At this time, the epihalohydrin to be used is not particularly limited, and examples thereof include epichlorohydrin, epibromohydrin, and β-methyl epichlorohydrin. Among these, since it is industrially easy to obtain, the epichlorohydrin is preferable.

In addition, specific examples of the basic catalyst include alkaline earth metal hydroxide, alkali metal carbonate, and alkali metal hydroxide. In particular, from the viewpoint of excellent catalytic activity in an epoxy resin synthesis reaction, the alkali metal hydroxide is preferable, and examples thereof include sodium hydroxide and potassium hydroxide. When using these, the basic catalysts thereof may be used in a form of approximately 10% by mass to 55% by mass of an aqueous solution or may be used in a solid form. In addition, when using an organic solvent in combination, it is possible to increase a reaction rate in the synthesis of the epoxy resin. These organic solvent is not particularly limited, and examples thereof include ketones such as acetone and methyl ethyl ketone, alcohols such as methanol, ethanol, 1-propyl alcohol, isopropyl alcohol, 1-butanol, secondary butanol, and tertiary butanol, cellosolves such as methyl cellosolve and ethyl cellosolve, ethers such as tetrahydrofuran, 1,4-dioxane, 1,3-dioxane, and diethoxyethane, and an aprotic polar solvent such as acetonitrile, dimethylsulfoxide, and dimethylformamide. One kind of these organic solvents may be used alone and two or more kinds thereof may be used in combination as appropriate in order to adjust the polarity.

Specific examples of the phase transfer catalyst include quaternary ammonium salt, quaternary phosphonium salt, and crown ether. In particular, from the viewpoint of excellent catalytic activity in the epoxy resin synthesis reaction, quaternary ammonium salt and quaternary phosphonium salt are preferable. Specific examples thereof include tetramethylammonium chloride, tetraethylammonium chloride, tetrabutylammonium bromide, trimethylbenzylammonium chloride, triethylbenzylammonium chloride, and tetrabutylphosphonium bromide. When using these, the basic catalysts thereof may be used in a form of approximately 10% by mass to 55% by mass of an aqueous solution or may be used in a solid form.

Subsequently, a reaction product of the epoxidation reaction is washed with water, and an unreacted epihalohydrin or an organic solvent to be used in combination are distilled off by distillation under heating and reduced pressure. Furthermore, in order to obtain an epoxy resin having less hydrolyzable halogen, the obtained epoxy resin is dissolved again in an organic solvent such as toluene, methyl isobutyl ketone, and methyl ethyl ketone, and an aqueous solution of alkali metal hydroxide such as sodium hydroxide and potassium hydroxide is added to be possible to further perform the reaction. In this case, a correlation transfer catalyst such as quaternary ammonium salt or crown ether may be present for the purpose of improving the reaction rate. In a case of using the correlation transfer catalyst, a using amount thereof is preferably in a range of 0.1% by mass to 3.0% by mass with respect to the epoxy resin to be used. After completion of the reaction, produced salt is removed by filtration, washing with water, and the like, and then the solvent such as toluene and methyl isobutyl ketone is distilled off under heating and reduced pressure to be possible to obtain the intended epoxy resin.

<Epoxy Resin Composition>

In the epoxy resin of the present invention, a curing agent can be used in combination. When mixing a curing agent to the epoxy resin, a curable epoxy resin composition can be prepared. Hereinafter, the epoxy resin of the present invention may be referred to as an epoxy resin (A) in some cases.

Examples of the curing agent that can be used here include various known curing agents for an epoxy resin, such as an amine compound, an amide compound, an acid anhydride compound, and a phenolic compound.

Specific examples of the amine compound include diaminodiphenylmethane, diethylenetriamine, triethylenetetramine, diaminodiphenylsulfone, isophoronediamine, imidazole, $BF_3$-amine complex, and guanidine derivative. Examples of the amide compound include dicyandiamide and polyamide resin synthesized from dimer of linolenic acid and ethylenediamine. Examples of the acid anhydride compound include phthalic anhydride, trimellitic anhydride, pyromellitic anhydride, maleic anhydride, tetrahydrophthalic anhydride, methyl tetrahydrophthalic anhydride, methyl nadic anhydride, hexahydrophthalic anhydride, and methyl hexahydrophthalic anhydride. Examples of the phenolic compound include phenol novolac resin, cresol novolac resin, aromatic hydrocarbon formaldehyde resin-modified phenolic resin, dicyclopentadiene phenol addition resin, phenol aralkyl resin (xyloc resin), naphthol aralkyl resin, triphenylol methane resin, tetraphenylolethane resin, naphthol novolac resin, naphthol-phenol co-condensed novolac resin, naphthol-cresol co-condensed novolac resin, biphenyl modified phenolic resin (a polyhydric phenolic hydroxyl group-containing compound in which a phenol nucleus is linked with a bismethylene group), biphenyl modified naphthol resin (a polyhydric naphthol compound in which a phenol nucleus is linked with a bismethylene group), and a polyhydric phenolic hydroxyl group-containing compound such as aminotriazine-modified phenolic resin (a polyhydric phenolic hydroxyl group-containing compound in which a phenol nucleus is linked with melamine, benzoguanamine, or the like), alkoxy group-containing aromatic ring-modified novolac resin (a polyhydric phenolic hydroxyl group-containing compound in which a phenol nucleus and an alkoxy group-containing aromatic ring are linked with formaldehyde).

Further, in the epoxy resin composition of the present invention, an epoxy resin (C) other than the epoxy resin (A) as specified above can be used in combination as long as the effect of the present invention is not impaired.

Examples of the epoxy resin (C) include bisphenol A epoxy resin, bisphenol F epoxy resin, biphenyl epoxy resin, tetramethylbiphenyl epoxy resin, polyhydroxynaphthalene epoxy resin, phenol novolac epoxy resin, cresol novolac epoxy resin, triphenyl methane epoxy resin, tetraphenylethane epoxy resin, dicyclopentadiene-phenol addition epoxy resin, phenol aralkyl epoxy resin, naphthol novolac epoxy resin, naphthol aralkyl epoxy resin, naphthol-phenol co-condensation novolac epoxy resin, naphthol-cresol co-condensation novolac epoxy resin, aromatic hydrocarbon formaldehyde resin modified phenoxy resin epoxy resin, and biphenyl modified novolac epoxy resin. Among these epoxy resins, in particular, from a viewpoint of obtaining a cured product excellent in hot elastic modulus and mold shrinkage, it is preferable to use the novolac epoxy resin. From a viewpoint of obtaining a cured product excellent in flame retardancy, it is preferable to use the tetramethylbiphenol epoxy resin, biphenyl aralkyl epoxy resin, and the polyhydroxynaphthalene epoxy resin. From a viewpoint of obtaining a cured product excellent in dielectric properties, dicyclopentadiene-phenol addition epoxy resin is preferable. In addition, in a case of using other epoxy resins in combination, it is preferable to include the epoxy resin (A) of the present invention in 1 to 20 parts by mass with respect to the total 100 parts by mass of the epoxy resin (A) and the epoxy resin (C), from a viewpoint that the mold shrinkage can be effectively reduced in a semiconductor encapsulating material.

In the epoxy resin composition of the present invention, a mixing amount of the epoxy resin (A) and the curing agent is preferably set such that a total active groups in the curing agent is 0.8 to 1.2 equivalent with respect to a total 1 equivalent of epoxy groups in the epoxy resin (A) and the epoxy resin (C) which is used in combination as needed.

In addition, the epoxy resin composition may be used in combination with other thermosetting resins.

Examples of other thermosetting resins include cyanate ester resin, resin having a benzoxazine structure, a maleimide compound, active ester resin, a vinylbenzyl compound, an acrylic compound, and a copolymer of styrene and maleic anhydride. In a case of using the other thermosetting resins in combination, a using amount thereof is not particularly limited as long as an effect of the present invention is not impaired. However, the using amount is preferably in a range of 1 to 50 parts by mass in 100 parts by mass of a thermosetting resin composition.

Examples of the cyanate ester resin include bisphenol A cyanate ester resin, bisphenol F cyanate ester resin, bisphenol E cyanate ester resin, bisphenol S cyanate ester resin, bisphenol sulfide cyanate ester resin, phenylene ether cyanate ester resin, naphthylene ether cyanate ester resin, biphenyl cyanate ester resin, tetramethylbiphenyl cyanate ester resin, polyhydroxynaphthalene cyanate ester resin, phenol novolac cyanate ester resin, cresol novolac cyanate ester resin, triphenyl methane cyanate ester resin, tetraphenylethane cyanate ester resin, dicyclopentadiene-phenol addition cyanate ester resin, phenol aralkyl cyanate ester resin, naphthol novolac cyanate ester resin, naphthol aralkyl cyanate ester resin, naphthol-phenol co-condensation novolac cyanate ester resin, naphthol-cresol co-condensed novolac cyanate ester resin, aromatic hydrocarbon formaldehyde resin modified phenol resin cyanate ester resin, biphenyl modified novolac cyanate ester resin, and anthracene cyanate ester resin. These may be used alone and two or more kinds thereof may be used in combination.

Among these cyanate ester resins, in particular, from a viewpoint of obtaining a cured product excellent in thermal resistance, it is preferable to use the bisphenol A cyanate ester resin, the bisphenol F cyanate ester resin, the bisphenol E cyanate ester resin, polyhydroxynaphthalene cyanate ester resin, naphthylene ether cyanate ester resin, and novolac cyanate ester resin. From a viewpoint of obtaining a cured product excellent in dielectric properties, the dicyclopentadiene-phenol addition cyanate ester resin is preferable.

The resin having a benzoxazine structure is not particularly limited, and examples thereof include a reaction product of bisphenol F, formalin, and aniline (F-a type benzoxazine resin), a reaction product of diaminodiphenylmethane, formalin, and phenol (P-d type benzoxazine resin), a reaction product of bisphenol A, formalin, and aniline, a reaction product of dihydroxydiphenyl ether, formalin, and aniline, a reaction product of diaminodiphenyl ether, formalin, and phenol, a reaction product of dicyclopentadiene-phenol addition resin, formalin, and aniline, a reaction product of phenolphthalein, formalin, and aniline, and a reaction product of diphenyl sulfide, formalin, and aniline. These may be used alone and two or more kinds thereof may be used in combination.

Examples of the maleimide compound include various compounds represented by any one of Structural Formulas (i) to (iii).

[Chem. 5]

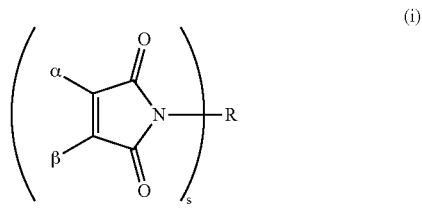

(In Formula, R represents an m-valent organic group, α and β each represent any one of a hydrogen atom, a halogen atom, an alkyl group, and an aryl group, and s represents an integer of 1 or more.)

[Chem. 6]

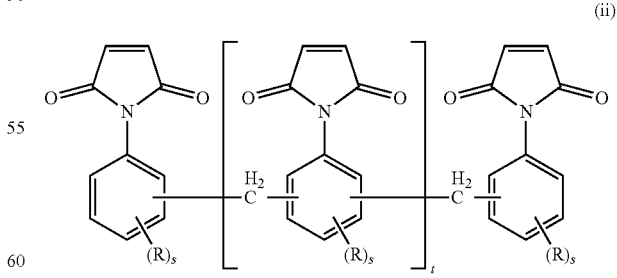

(In Formula, R represents any one of a hydrogen atom, an alkyl group, an aryl group, an aralkyl group, a halogen atom, a hydroxyl group, and an alkoxy group, s represents an integer of 1 to 3, and t represents 0 to 10 as an average of repeating units.)

[Chem. 7]

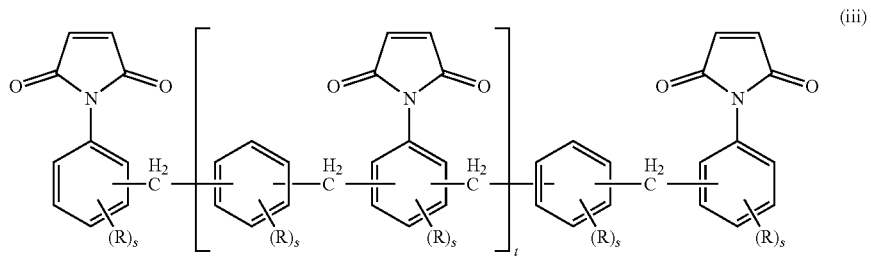

(In Formula, R represents any one of a hydrogen atom, an alkyl group, an aryl group, an aralkyl group, a halogen atom, a hydroxyl group, and an alkoxy group, s represents an integer of 1 to 3, and t represents 0 to 10 as an average of repeating units.) These may be used alone, or two or more of kinds thereof may be used in combination.

The active ester resin is not particularly limited. In general, it is preferable to use a compound which has two or more ester groups having high reactivity such as phenol esters, thiophenol esters, N-hydroxyamine esters, esters of heterocyclic hydroxy compound in one molecule. The active ester resin is preferably obtained by a condensation reaction of a carboxylic acid compound and/or a thiocarboxylic acid compound with a hydroxy compound and/or a thiol compound. In particular, from a viewpoint of improving thermal resistance, an active ester resin obtained from the carboxylic acid compound or halide thereof and the hydroxy compound is preferable. An active ester resin obtained from the carboxylic acid compound or halide thereof and a phenol compound and/or a naphthol compound is more preferable. Examples of the carboxylic acid compound include benzoic acid, acetic acid, succinic acid, maleic acid, itaconic acid, phthalic acid, isophthalic acid, terephthalic acid, and pyromellitic acid, or halides thereof. Examples of the phenol compound or the naphthol compound include hydroquinone, resorcin, bisphenol A, bisphenol F, bisphenol S, dihydroxydiphenyl ether, phenolphthalein, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzene triol, dicyclopentadiene-phenol addition resin.

As the active ester resin, specifically, an active ester resin including a dicyclopentadiene-phenol addition structure, an active ester resin including a naphthalene structure, an active ester resin which is an acetylated product of phenol novolac, and an active ester resin which is a benzoylated product of phenol novolac are preferable. Among these, from a viewpoint of excellent in improvement of peel strength, the active ester resin including a dicyclopentadiene-phenol addition structure and the active ester resin including a naphthalene structure are more preferable. Examples of the active ester resin including a dicyclopentadiene-phenol addition structure more specifically include a compound represented by General Formula (iv).

[Chem. 8]

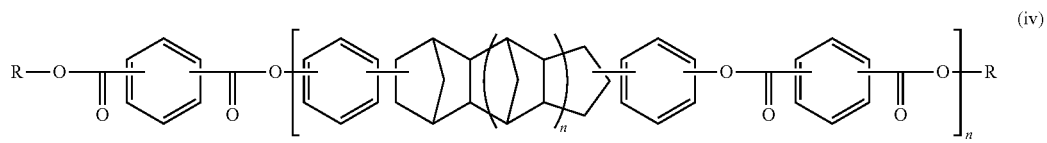

In Formula (iv), R represents a phenyl group or a naphthyl group, u represents 0 or 1, and n represents 0.05 to 2.5 as an average of repeating units. From viewpoints of lowering the dielectric loss tangent of the cured product of the resin composition and improving the thermal resistance, R is preferably a naphthyl group, u is preferably 0, and n is preferably 0.25 to 1.5.

In the epoxy resin composition of the present invention, curing proceeds only with epoxy resin composition, but a curing accelerator may be used in combination. Examples of the curing accelerator include a tertiary amine compound such as imidazole and dimethylaminopyridine; a phosphorus compound such as triphenylphosphine; boron trifluoride amine complex such as boron trifluoride and boron trifluoride monoethylamine complex; an organic acid compound such as thiodipropionic acid; a benzoxazine compound such as thiodiphenol benzoxazine and sulfonylbenzoxazine; and a sulfonyl compound. These may be used alone and two or more kinds thereof may be used in combination. An addition amount of these catalysts is preferably in a range of 0.001 to 15 parts by mass in 100 parts by mass of the epoxy resin composition.

In addition, when used for an application requiring a high flame retardancy for the epoxy resin composition of the present invention, a halogen-free flame retardant substantially including no halogen atom may be mixed.

Examples of the halogen-free flame retardant include phosphorus flame retardant, nitrogen flame retardant, silicone flame retardant, inorganic flame retardant, and organometallic salt flame retardant. When using these, there is no limitation. These may be used alone. The same type of flame retardants may be used in plural. In addition, different flame retardants can be used in combination.

As the phosphorus flame retardant, both inorganic and organic flame retardants can be used. Examples of the inorganic compound include ammonium phosphates such as red phosphorus, monoammonium phosphate, diammonium phosphate, triammonium phosphate, and ammonium polyphosphate and an inorganic nitrogen-containing phosphorus compound such as phosphoric acid amide.

In addition, the red phosphorus is preferably subjected to a surface treatment for the purpose of preventing hydrolysis or the like. Examples of the surface treatment method include (i) a method of coating with an inorganic compound such as magnesium hydroxide, aluminum hydroxide, zinc hydroxide, titanium hydroxide, bismuth oxide, bismuth hydroxide, and bismuth nitrate, or a mixture thereof, (ii) a method of coating with a mixture of an inorganic compound such as magnesium hydroxide, aluminum hydroxide, zinc hydroxide, and titanium hydroxide, and a thermosetting resin such as phenol resin, and (iii) a method of double coating a film coated with an inorganic compound such as magnesium hydroxide, aluminum hydroxide, zinc hydroxide, and titanium hydroxide, with a thermosetting resin such as phenol resin.

Examples of the organic phosphorus compound include a cyclic organophosphorus compound such as 9,10-dihydro-9-oxa-10-phosphaphenanthrene-10-oxide, 10-(2,5-dihydroxyphenyl)-10H-9-oxa-10-phosphaphenanthrene-10-oxide, and 10-(2,7-dihydroxynaphthyl)-10H-9-oxa-10-phosphaphenanthren e-10-oxide and a derivative obtained by reacting the cyclic organophosphorus compounds with a compound such as epoxy resin or phenol resin, in addition to a general purpose organophosphorus compound such as a phosphoric ester compound, a phosphonic acid compound, a phosphinic acid compound, a phosphine oxide compound, a phospholane compounds, and an organic nitrogen-containing phosphorus compound.

A mixing amount of the phosphorus flame retardant is appropriately selected depending on types of the phosphorus flame retardant, other components of the resin composition, and a degree of desired flame retardancy. For example, in 100 parts by mass of the resin composition in which all of halogen-free flame retardant, other filler or additives, and the like were mixed, in a case of using the red phosphorus as the halogen-free flame retardant, it is preferable to mix the phosphorus flame retardant in a range of 0.1 parts by mass to 2.0 parts by mass, in a case of using the organic phosphorus compound, similarly, it is preferable to mix the phosphorus flame retardant in a range of 0.1 parts by mass to 10.0 parts by mass, more preferably in a range of 0.5 parts by mass to 6.0 parts by mass.

In addition, in a case of using the phosphorus flame retardant, the phosphorus flame retardant may be used in combination with hydrotalcite, magnesium hydroxide, a boron compound, zirconium oxide, black dye, calcium carbonate, zeolite, zinc molybdate, and activated carbon.

Examples of the nitrogen flame retardant include a triazine compound, a cyanuric acid compound, an isocyanuric acid compound, and a phenothiazine. The triazine compound, the cyanuric acid compound, and the isocyanuric acid compound are preferable.

Examples of the triazine compound include (1) an aminotriazine sulfate compound such as guanyl sulfate melamine, melem sulfate, and melam sulfate, (2) a co-condensate of phenols such as phenol, cresol, xylenol, butylphenol, and nonylphenol with melamines such as melamine, benzoguanamine, acetoguanamine, and formoguanamine, and formaldehyde, (3) a mixture of the cocondensate of (2) and a phenolic resin such as phenol formaldehyde condensate, and (4) a compound obtained by further modifying (2) and (3) with tung oil, isomerized linseed oil, or the like, in addition to melamine, acetoguanamine, benzoguanamine, melon, melam, succinoguanamine, ethylenedimelamine, melamine polyphosphate, and triguanamine.

Examples of the cyanuric acid compound include cyanuric acid and melamine cyanurate.

A mixing amount of the nitrogen flame retardant is appropriately selected depending on types of the nitrogen flame retardant, other components of the resin composition, and a degree of desired flame retardancy. For example, in 100 parts by mass of the resin composition in which all of halogen-free flame retardant, other filler or additives, and the like were mixed, it is preferable to mix the nitrogen flame retardant in a range of 0.05 parts by mass to 10 parts by mass, and more preferably in a range of 0.1 parts by mass to 5 parts by mass.

In addition, when using the nitrogen flame retardant, a metal hydroxide, a molybdenum compound, or the like may be used in combination.

The silicone flame retardant can be used without particular limitation as long as it is an organic compound including a silicon atom, and examples thereof include silicone oil, silicone rubber, and silicone resin. A mixing amount of the silicone flame retardant is appropriately selected depending on types of the silicone flame retardant, other components of the resin composition, and a degree of desired flame retardancy. For example, in 100 parts by mass of the resin composition in which all of halogen-free flame retardant, other filler or additives, and the like were mixed, it is preferable to mix the silicone flame retardant in a range of 0.05 to 20 parts by mass. In addition, when using the silicone flame retardant, a molybdenum compound, alumina, or the like may be used in combination.

Examples of the inorganic flame retardant include metal hydroxide, metal oxide, a metal carbonate compound, a metal powder, a boron compound, and low melting point glass.

Examples of the metal hydroxide include aluminum hydroxide, magnesium hydroxide, dolomite, hydrotalcite, calcium hydroxide, barium hydroxide, and zirconium. hydroxide.

Examples of the metal oxide include zinc molybdate, molybdenum trioxide, zinc stannate, tin oxide, aluminum oxide, iron oxide, titanium oxide, manganese oxide, zirconium oxide, zinc oxide, molybdenum oxide, cobalt oxide, bismuth oxide, chromium oxide, nickel oxide, copper oxide, and tungsten oxide.

Examples of the metal carbonate compound include zinc carbonate, magnesium carbonate, calcium carbonate, barium carbonate, basic magnesium carbonate, aluminum carbonate, iron carbonate, cobalt carbonate, and titanium carbonate.

Examples of the metal powder include aluminum, iron, titanium, manganese, zinc, molybdenum, cobalt, bismuth, chromium, nickel, copper, tungsten, and tin.

Examples of the boron compound include zinc borate, zinc metaborate, barium metaborate, boric acid, and borax.

Examples of the low melting point glass can include vitreous compounds of Shipley (Boxsy-Braun), hydrated glass $SiO_2$—$MgO$—$H_2O$, $PbO$—$B_2O_3$ type, $ZnO$—$P_2O_5$—$MgO$ type, $P_2O_5$—$B_2O_3$—$PbO$—$MgO$ type, P—Sn—O—F type, $PbO$—$V_2O_5$—$TeO_2$ type, $Al_2O_3$—$H_2O$ type, lead borosilicate type, and the like.

A mixing amount of the inorganic flame retardant is appropriately selected depending on types of the inorganic flame retardant, other components of the resin composition, and a degree of desired flame retardancy. For example, in 100 parts by mass of the resin composition in which all of halogen-free flame retardant, other filler or additives, and the like were mixed, it is preferable to mix the inorganic flame retardant in a range of 0.05 parts by mass to 20 parts by mass, and more preferably in a range of 0.5 parts by mass to 15 parts by mass.

Examples of the organometallic salt flame retardant include ferrocene, acetylacetonate metal complex, an organic metal carbonyl compound, an organic cobalt salt compound, organic sulfonic acid metal salt, and a compound in which a metal atom is ionically bonded or coordination bonded with an aromatic compound or a heterocyclic compound.

A mixing amount of the organometallic salt flame retardant is appropriately selected depending on types of the organometallic salt flame retardant, other components of the resin composition, and a degree of desired flame retardancy. For example, in 100 parts by mass of the resin composition in which all of halogen-free flame retardant, other filler or additives, and the like were mixed, it is preferable to mix the organometallic salt flame retardant in a range of 0.005 parts by mass to 10 parts by mass.

In the epoxy resin composition of the present invention, an inorganic filler can be mixed as needed. Examples of the inorganic filler include fused silica, crystalline silica, alumina, silicon nitride, and aluminum hydroxide. In a case where a mixing amount of the inorganic filler is set to be particularly large, it is preferable to use the fused silica. The fused silica can be used in any of a crushed form or a spherical form. However, in order to increase the mixing amount of the fused silica and suppress an increase of melting viscosity of a molding material, it is preferable to use mainly the fused silica in the spherical form. Further, in order to increase the mixing amount of spherical silica, it is preferable to appropriately adjust a particle size distribution of the spherical silica. Considering the flame retardancy, a filling factor is preferably high, and particularly preferably 20% by mass or more with respect to the total mass of the epoxy resin composition. In addition, in a case of being used for an application such as conductive paste, a conductive filler such as silver powder or copper powder can be used.

In the epoxy resin composition of the present invention, in addition to this, as needed, various additives such as a silane coupling agent, a releasing agent, a pigment, and an emulsifying agent can be added.

<Application of Epoxy Resin Composition>

The epoxy resin composition of the present invention can be applied to a semiconductor encapsulating material, a semiconductor device, prepreg, a printed circuit board, a buildup substrate, a buildup film, a fiber-reinforced composite material, a fiber-reinforced resin molded article, conductive paste, and the like.

1. Semiconductor Encapsulating Material

A method of obtaining the semiconductor encapsulating material from the epoxy resin composition of the present invention may include sufficiently melting and mixing the epoxy resin composition, the curing accelerator, and a compounding agent such as an inorganic filler using, as needed, an extruder, a kneader, a roll or the like to form a uniform mixture. In this case, as the inorganic filler, the fused silica is generally used. However, in a case of being used as a high thermal conductive semiconductor encapsulant for a power transistor or a power IC, highly filling with crystalline silica, alumina, silicon nitride or the like having a thermal conductivity higher than that of fused silica may be used, or fused silica, crystalline silica, alumina, silicon nitride, or the like may be used. As a filling factor thereof, it is preferable to use the inorganic filler in a range of 30% by mass to 95% by mass per 100 parts by mass of the epoxy resin composition. Among the range, in order to achieve improvement of flame retardancy, moisture resistance, or solder crack resistance and reduction of linear expansion coefficient, it is more preferable to be 70 parts by mass or more, and it is still more preferable to be 80 parts by mass or more.

2. Semiconductor Device

Examples of a method of obtaining the semiconductor device from the epoxy resin composition of the present invention include a method of casting or molding the semiconductor encapsulating material using a transfer molding machine, an injection molding machine, or the like, and further heating at 50 to 200° C. for 2 to 10 hours.

3. Prepreg

Examples of a method of obtaining the prepreg from the epoxy resin composition of the present invention include a method of obtaining the prepreg by impregnating a reinforcing substrate (such as paper, glass cloth, glass nonwoven fabric, aramid paper, aramid cloth, glass mat, and glass roving cloth) with a curable resin composition which was mixed with an organic solvent and varnished, and then heating at a heating temperature corresponding to types of a solvent used, preferably, 50 to 170° C. A mass ratio of the resin composition and the reinforcing substrate used at this time is not particularly limited. In general, it is preferable to prepare the prepreg such that a resin content in the prepreg is 20% by mass to 60% by mass.

Examples of the organic solvent used here include methyl ethyl ketone, acetone, dimethylformamide, methyl isobutyl ketone, methoxypropanol, cyclohexanone, methyl cellosolve, ethyl diglycol acetate, and propylene glycol monomethyl ether acetate. Selection thereof or an appropriate using amount can be appropriately selected depending on an application. For example, in a case of further producing the printed circuit board from the prepreg as follows, it is preferable to use a polar solvent having a boiling point of 160° C. or less such as methyl ethyl ketone, acetone, and dimethylformamide, and also, it is preferable to use the organic solvent such that a nonvolatile content is 40% by mass to 80% by mass.

4. Printed Circuit Board

Examples of a method of obtaining the printed circuit board from the epoxy resin composition of the present invention include a method of laminating the prepreg in a general method, stacking a copper foil appropriately, and performing thermocompression bonding at 170 to 300° C. for 10 minutes to 3 hours under a pressure of 1 to 10 MPa.

5. Buildup Substrate

Examples of a method of obtaining the buildup substrate from the epoxy resin composition of the present invention include a method via Steps 1 to 3. In Step 1, first, a circuit board in which a circuit was formed is coated with the curable resin composition, in which rubber, filler, and the like were appropriately mixed, using a spray coating method, a curtain coating method, and the like, and the curable resin composition is cured. In Step 2, as needed, a predetermined through hole portion or the like is drilled in a circuit board coated with the epoxy resin composition, then treated with a roughening agent, and a surface thereof is washed with hot water, whereby forming irregularities on the board and plating a metal such as copper. In Step 3, the operations of Steps 1 and 2 are repeated in order as desired, and a resin insulating layer and a conductor layer having a predetermined circuit pattern are alternately built up to forma buildup substrate. In the steps, drilling of the through hole portion may be performed after the resin insulating layer of the outermost layer is formed. In addition, in the buildup substrate of the present invention, a resin-coated copper foil in which the resin composition was semi-cured on a copper foil is subjected to thermocompression bonding at 170 to 300° C. onto a wiring board on which a circuit was formed. Accordingly, it is also possible to produce the buildup substrate without formation of the roughened surface and the plating process.

6. Buildup Film

Examples of the buildup film from the epoxy resin composition of the present invention include a method of coating a support film with the curable resin composition and drying to form a resin composition layer on the support film. In a case of using the epoxy resin composition of the present invention for the buildup film, in the film, it is important to be softened at a temperature condition (in general, 70° C. to 140° C.) of laminating in a vacuum lamination method and exhibit fluidity (resin flow) capable of filling via hole or through hole present in the circuit board with resin, at the same time as the lamination of the circuit board. Therefore, it is preferable to mix the respective components so as to exhibit such properties.

Here, a diameter of the through hole of the circuit board is 0.1 to 0.5 mm in general, and a depth is 0.1 to 1.2 mm in general. In general, it is preferable that filling with resin is possible within the range. In a case where both sides of the circuit board are laminated, it is preferable that approximately half of the through hole is filled.

Examples of a specific method of producing the buildup film include a method in which after preparing an epoxy resin composition which was varnished by mixing an organic solvent thereto, a surface of a support film (Y) is coated with the composition, and further the organic solvent is dried by heating or blowing with hot air, or the like to form a layer (X) of the epoxy resin composition.

As the organic solvent used here, it is preferable to use ketones such as acetone, methyl ethyl ketone, and cyclohexanone, acetate esters such as ethyl acetate, butyl acetate, cellosolve acetate, propylene glycol monomethyl ether acetate, and carbitol acetate, carbitols such as cellosolve and butyl carbitol, aromatic hydrocarbons such as toluene and xylene, dimethylformamide, dimethylacetamide, and N-methylpyrrolidone. In addition, it is preferable to use the organic solvent such that a nonvolatile content is 30% by mass to 60% by mass.

A thickness of the layer (X) of the resin composition to be formed needs to be equal to or larger than the thickness of the conductor layer, in general. Since the thickness of the conductor layer that the circuit board has is in a range of 5 to 70 μm in general, the resin composition layer preferably has a thickness of 10 to 100 μm. The layer (X) of the resin composition in the present invention may be protected with a protective film to be described later. When being protected with the protective film, it is possible to prevent dust from adhering or scratches from occurring on a surface of the resin composition layer.

Examples of the support film and the protective film include polyolefin such as polyethylene, polypropylene, and polyvinyl chloride, polyester such as polyethylene terephthalate (hereinafter, abbreviated as "PET" in some cases) and polyethylene naphthalate, polycarbonate, polyimide, and release paper or metal foil such as copper foil and aluminum foil. The support film and the protective film may be subjected to a release treatment in addition to a mud treatment and a corona treatment. A thickness of the support film is not particularly limited, but is 10 to 150 μm in general, and preferably used in a range of 25 to 50 μm. In addition, a thickness of the protective film is preferably 1 to 40 μm.

The support film (Y) is peeled off after being laminated on the circuit board or after forming the insulating layer by thermal curing. If the support film (Y) is peeled off after the epoxy resin composition layer forming the buildup film is cured by heating, it is possible to prevent dust and the like from adhering in the curing step. In case of peeling after curing, the support film is subjected to releasing treatment in advance, in general.

A multilayer printed circuit board can be produced from the buildup film obtained as described above. For example, in a case where the layer (X) of the resin composition is protected with the protective film, the protective film is peeled off, and then the layer (X) of the resin composition is laminated to one side or both sides of the circuit board so as to directly contact with the circuit board, for example, by a vacuum lamination method. A method of lamination may be a batch type or continuous type with a roll. In addition, as needed, the buildup film and the circuit board may be heated (preheated) before laminating. As conditions of the lamination, a pressure bonding temperature (lamination temperature) is preferably 70 to 140° C., a pressure bonding pressure is preferably 1 to 11 kgf/cm$^2$ ($9.8 \times 10^4$ to $107.9 \times 10^4$ N/m$^2$), and it is preferable to perform lamination under a reduced pressure of 20 mmHg (26.7 hPa) or less as air pressure.

7. Fiber-Reinforced Composite Material

A method of obtaining a fiber-reinforced composite material (a sheet-shaped intermediate material including reinforcing fibers impregnated with the resin) from the epoxy resin composition of the present invention may include uniformly mixing respective components for forming the epoxy resin composition to prepare a varnish, then impregnating, with the varnish, a reinforcing base material including reinforcing fibers, and then subjecting the mixture to polymerization reaction to produce the fiber-reinforced composite material.

Specifically, a curing temperature when performing such a polymerization reaction is preferably in a temperature range of 50 to 250° C. In particular, it is preferable to perform curing at 50 to 100° C. to obtain a cured product in a tack-free state and then further perform the treatment under the temperature condition of 120 to 200° C.

Here, reinforcing fiber may be any of twisted yarn, untwisted yarn, and non-twisted yarn. However, since it is possible to compatible both moldability and mechanical strength of fiber reinforced plastic member, the twisted yarn or the non-twisted yarn is preferable. Further, as a form of the reinforcing fiber, those in which the fiber directions are aligned in one direction and fabrics can be used. For the fabrics, it can be freely selected from plain weave, satin weave, and the like, depending on a site to be used or an application. Specifically, examples thereof include carbon fibers, glass fibers, aramid fibers, boron fibers, alumina fibers, and silicon carbide fibers, as these are excellent in mechanical strength and durability. Two or more kinds thereof can be used in combination. Among these, from a viewpoint that a strength of a molded article is favorable, the carbon fiber is preferable. Various types of these carbon fibers such as polyacrylonitrile type, pitch type, and rayon type can be used. Among these, the polyacrylonitrile type which can easily obtain carbon fibers having high strength is preferable. Here, a using amount of the reinforcing fibers when impregnating reinforcing substrate formed of reinforcing fibers with varnish to obtain the fiber-reinforced composite material is preferably an amount at which a volume content ratio of the reinforcing fibers in the fiber-reinforced composite material is in a range of 40% to 85%.

8. Fiber-Reinforced Resin Molded Article

Examples of a method of obtaining the fiber reinforced molded article (a molded article which is a cured sheet-shaped member in which reinforcing fibers were impregnated with rein) from the epoxy resin composition of the present invention include a method in which prepreg obtained by impregnating the reinforcing fibers with the varnish is prepared using: a hand lay up method or a spray-up method in which fibrous aggregate is laid in a mold and the varnish is laminated in multiple layers; a vacuum bag method in which using either male type or female type, a substrate formed of reinforcing fibers is laminated while impregnating with the varnish to cover with a flexible mold capable of molding and acting a pressure on the formed product to hermetically seal the mold so as to perform vacuum (decompression) molding; an SMC press method in which a varnish containing reinforcing fibers is made to be a sheet-shape in advance and this is compression molded by a mold; and an RTM method in which the varnish is injected into a mold in which fibers are laid and packed, and the prepared prepreg is baked in a large autoclave. The fiber-reinforced resin molded article obtained as above is a molded article including the reinforcing fibers and a cured product of the epoxy resin composition. Specifically, the amount of the reinforcing fibers in the fiber reinforced molded article is preferably in a range of 40% by mass to 70% by mass, and from the viewpoint of strength, is particularly preferably in a range of 50% by mass to 70% by mass.

9. Conductive Paste

Examples of a method of obtaining the conductive paste from the epoxy resin composition of the present invention include a method of dispersing fine conductive particles in the curable resin composition. The conductive paste can be used as a circuit connection paste resin composition or an anisotropic conductive adhesive depending on types of fine conductive particles to be used.

EXAMPLES

Next, the present invention will be more specifically described using Examples and Comparative Examples, and in the following, "parts" and "%" are a mass basis unless otherwise specified. GPC, $^{13}$CNMR, FD-MS spectrum, and high performance liquid chromatography (hereinafter referred to as HPLC) were measured under the following conditions.

<GPC Measurement Conditions> measurement device: "HLC-8320 GPC" manufactured by TOSOH CORPORATION

Column: Guard column "HXL-L" manufactured by TOSOH CORPORATION

+"TSK-GEL G2000HXL" manufactured by TOSOH CORPORATION

+"TSK-GEL G2000HXL" manufactured by TOSOH CORPORATION

+"TSK-GEL G3000HXL" manufactured by TOSOH CORPORATION

+"TSK-GEL G4000HXL" manufactured by TOSOH CORPORATION

Detector: RI (refractive index detector)

Data processing: "GPC workstation EcoSEC-WorkStation" manufactured by TOSOH CORPORATION Measurement condition: column temperature 40° C.

Development solvent Tetrahydrofuran

Flow rate 1.0 ml/min

Standard: the following monodisperse polystyrene of which a molecular weight is known was used in accordance with the measurement manual of "GPC workstation Eco-SEC-WorkStation".

(Polystyrene Used)

"A-500" manufactured by TOSOH CORPORATION
"A-1000" manufactured by TOSOH CORPORATION
"A-2500" manufactured by TOSOH CORPORATION
"A-5000" manufactured by TOSOH CORPORATION
"F-1" manufactured by TOSOH CORPORATION
"F-2" manufactured by TOSOH CORPORATION
"F-4" manufactured by TOSOH CORPORATION
"F-10" manufactured by TOSOH CORPORATION
"F-20" manufactured by TOSOH CORPORATION
"F-40" manufactured by TOSOH CORPORATION
"F-80" manufactured by TOSOH CORPORATION
"F-128" manufactured by TOSOH CORPORATION Sample: obtained by filtering a tetrahydrofuran solution of 1.0% by mass in terms of solid resin content, with a microfilter (50 µl).

<$^{13}$C-NMR Measurement Conditions>

Device: AL-400 manufactured by JEOL Ltd.
Measurement mode: Decoupling with reverse gate
Solvent: deuterated dimethylsulfoxide
Pulse angle: 45° pulse
Sample concentration: 30 wt %
Cumulative number: 4000 times <FD-MS Spectrum Measurement Conditions>

The FD-MS spectrum was measured using a double beam mass analysis device "AX505H (FD505H)" manufactured by JEOL Ltd.

<HPLC Measurement Conditions>

"Agilent 1220 Infinity LC" manufactured by TOSOH CORPORATION

Column: "TSK-GEL ODS-120T" manufactured by TOSOH CORPORATION

Detector: VWD

Data processing: "Agilent EZChrom Elite" manufactured by TOSOH CORPORATION

Measurement condition: column temperature 40° C.

Development solvent
A solution: water/acetonitrile=50/50 wt %
B solution: acetonitrile Development Condition
A solution/B solution=95/5 (15 min)
Linear gradient (20 min)
Solution A/Solution B=0/100 (20 min)
Flow rate 1.0 ml/min
Measurement wavelength 254 nm Synthesis Example 1 Synthesis of Epoxy Resin (A-1)

164.7 g of 4-t-butylcatechol, 1.3 g of 3,5-di-t-butylcatechol, 555 g (6.0 mol) of epichlorohydrin, and 165 g of n-butanol were charged and dissolved while purging a flask equipped with a thermometer, a cooling tube, and a stirrer with a nitrogen gas. After raising a temperature to 50° C., 440 g (2.2 mol) of 20% aqueous sodium hydroxide solution was added over 3 hours, and then reaction was further performed at 50° C. for 1 hour. After completion of the reaction, unreacted epichlorohydrin was distilled off at 150° C. under a reduced pressure. Next, 300 g of methyl isobutyl ketone and 50 g of n-butanol were added to and dissolved in the obtained crude epoxy resin. Further, 15 parts of a 10% by mass aqueous sodium hydroxide solution was added to the solution, and the mixture was reacted at 80° C. for 2 hours. Then, the washing with water was repeated three times with 100 g of water until a pH of the washing solution became neutral. Subsequently, an inside of the system was dehydrated by azeotropic distillation, and after undergoing microfiltration, the solvent was distilled off under the reduced pressure to obtain 240 g of an epoxy resin (A-1). An epoxy equivalent of the obtained epoxy resin was 209 g/eq. For the obtained epoxy resin, a GPC chart is shown in FIG. 1, a FD-MS spectrum is shown in FIG. 2, a $^{13}$C-NMR spectrum is shown in FIG. 3, and an HPLC chart is shown in FIG. 4. An area ratio of the compound ($\alpha$) in the epoxy resin was 0.70% in the GPC measurement. ($\beta1+\beta2$)/($\gamma$) based on the HPLC measurement was 0.24.

Synthesis Example 2 Synthesis of Epoxy Resin (A-2)

Except for changing the 4-t-butylcatechol to be 165.5 g, 3,5-di-t-butylcatechol to be 0.5 g, epichlorohydrin to be 370 g (4.0 mol), and n-butanol to be 110 g, an epoxy resin (A-2) was obtained in the same method as Synthesis Example 1. An epoxy equivalent of the obtained epoxy resin was 371 g/eq. For the obtained epoxy resin, a GPC chart is shown in FIG. 5 and an HPLC chart is shown in FIG. 6. An area ratio of the compound ($\alpha$) in the epoxy resin was 0.21%. ($\beta1+\beta2$)/($\gamma$) based on the HPLC measurement was 0.92.

Synthesis Example 3 Synthesis of Epoxy Resin (A-3)

165.0 g of 4-t-butylcatechol, 1.0 g of 3,5-di-t-butylcatechol, 555 g (6.0 mol) of epichlorohydrin, and 165 g of n-butanol were charged and dissolved while purging a flask equipped with a thermometer, a cooling tube, and a stirrer with a nitrogen gas. After raising a temperature to 70° C., 5 g of 50% tetramethylammonium chloride aqueous solution was added to perform a reaction for 6 hour. Thereafter, 440 g (2.2 mol) of 20% aqueous sodium hydroxide solution was added over 3 hours, and then reaction was further performed at 50° C. for 1 hour. After completion of the reaction, unreacted epichlorohydrin was distilled off at 150° C. under a reduced pressure. Next, 300 g of methyl isobutyl ketone and 50 g of n-butanol were added to and dissolved in the obtained crude epoxy resin. Further, 15 parts of a 10% by mass aqueous sodium hydroxide solution was added to the solution, and the mixture was reacted at 80° C. for 2 hours. Then, the washing with water was repeated three times with 100 g of water until a pH of the washing solution became neutral. Subsequently, an inside of the system was dehydrated by azeotropic distillation, and after undergoing microfiltration, the solvent was distilled off under the reduced pressure to obtain an epoxy resin (A-3). An epoxy equivalent of the obtained epoxy resin was 179 g/eq. For the obtained epoxy resin, a GPC chart is shown in FIG. 7 and an HPLC chart is shown in FIG. 8. An area ratio of the compound ($\alpha$) in the epoxy resin was 0.55%. ($\beta1+\beta2$)/($\gamma$) based on the HPLC measurement was 0.14.

Synthesis Example 4 Synthesis of Epoxy Resin (A-4)

Except for using 166.0 g of DIC-TBC (manufactured by DIC Corporation) which is a commercially available product of the t-butylcatechol and changing epichlorohydrin to be 740 g (8.0 mol), and n-butanol to be 222 g, an epoxy resin (A-4) was obtained in the same method as Synthesis Example 1. An epoxy equivalent of the obtained epoxy resin was 198 g/eq, and the viscosity at 25° C. was 1,030 MPa·s. An HPLC chart of the obtained epoxy resin is shown in FIG. 9. In the epoxy resin, an area ratio ($\beta1+\beta2$)/($\gamma$) by an HPLC was 0.19.

Comparative Synthesis Example 1 Synthesis of Epoxy Resin (A'-1)

166.0 g of DIC-TBC and 555 g (6.0 mol) of epichlorohydrin were charged and dissolved while purging a flask equipped with a thermometer, a cooling tube, and a stirrer with a nitrogen gas. After raising a temperature to 110° C., 5 g of 50% tetramethylammonium chloride aqueous solution was added to perform a reaction for 3 hours. Thereafter, 440 g (2.2 mol) of 20% aqueous sodium hydroxide solution was added over 3 hours, and then reaction was further performed at 50° C. for 1 hour. After completion of the reaction, unreacted epichlorohydrin was distilled off at 150° C. under a reduced pressure. Next, 300 g of methyl isobutyl ketone and 50 g of n-butanol were added to and dissolved in the obtained crude epoxy resin. Further, 15 parts of a 10% by mass aqueous sodium hydroxide solution was added to the solution, and the mixture was reacted at 80° C. for 2 hours. Then, the washing with water was repeated three times with 100 g of water until a pH of the washing solution became neutral. Subsequently, an inside of the system was dehydrated by azeotropic distillation, and after undergoing microfiltration, the solvent was distilled off under the reduced pressure to obtain an epoxy resin (A'-1). An epoxy equivalent of the obtained epoxy resin was 240 g/eq, and the viscosity at 25° C. was 2,690 MPa·s. An HPLC chart of the obtained epoxy resin is shown in FIG. 10. In the epoxy resin, an area ratio of ($\beta1+\beta2$)/($\gamma$) by an HPLC was 0.44.

Comparative Synthesis Example 2 Synthesis of Epoxy Resin (A'-2)

166.0 g of DIC-TBC and 1110 g (12.0 mol) of epichlorohydrin were charged and dissolved while purging a flask equipped with a thermometer, a cooling tube, and a stirrer with a nitrogen gas. After raising a temperature to 40° C., 7.4 g of benzyltrimethylammonium chloride was added to perform a reaction for 48 hours. Thereafter, 440 g (2.2 mol) of 20% aqueous sodium hydroxide solution was added over 3 hours, and then reaction was further performed at 50° C. for 1 hour. After completion of the reaction, unreacted epichlorohydrin was distilled off at 150° C. under a reduced pressure. Next, 300 g of methyl isobutyl ketone and 50 g of n-butanol were added to and dissolved in the obtained crude epoxy resin. Further, 15 parts of a 10% by mass aqueous sodium hydroxide solution was added to the solution, and the mixture was reacted at 80° C. for 2 hours. Then, the washing with water was repeated three times with 100 g of water until a pH of the washing solution became neutral. Subsequently, an inside of the system was dehydrated by azeotropic distillation, and after undergoing microfiltration, the solvent was distilled off under the reduced pressure to obtain an epoxy resin (A'-2). An epoxy equivalent of the obtained epoxy resin was 205 g/eq, and the viscosity at 25° C. was 3,560 MPa·s. An HPLC chart of the obtained epoxy resin is shown in FIG. 11. In the epoxy resin, an area ratio of ($\beta1+\beta2$)/($\gamma$) by an HPLC was 0.09.

The following compounds were mixed in the composition shown in Table 1 and melt-kneaded at a temperature of 90° C. for 5 minutes using a twin-roll to prepare an intended curable resin composition. The abbreviations in Table 1 mean the following compounds.

Epoxy resin A-1: an epoxy resin obtained in Synthesis Example 1
Epoxy resin A-2: an epoxy resin obtained in Synthesis Example 2
Epoxy resin A-3: an epoxy resin obtained in Synthesis Example 3
Epoxy resin A-4: an epoxy resin obtained in Synthesis Example 4
Epoxy resin A'-1: an epoxy resin obtained in Comparative Synthesis Example 1
Epoxy resin A'-2: an epoxy resin obtained in Comparative Synthesis Example 2
N-655-EXP-S: cresol novolac epoxy resin ("N-655-EXP-S" manufactured by DIC Corporation, epoxy equivalent: 201 g/eq)
N-770: phenol novolac epoxy resin ("N-770" manufactured by DIC Corporation, epoxy equivalent: 190 g/eq)
HP-5000: methoxynaphthalene-modified novolac epoxy resin ("HP-5000" manufactured by DIC Corporation, epoxy equivalent: 250 g/eq)
NC-3000: biphenyl aralkyl epoxy resin ("NC-3000" manufactured by Nippon Kayaku Co., Ltd., epoxy equivalent: 278 g/eq)
NC-2000L: phenol aralkyl epoxy resin ("NC-2000L" manufactured by Nippon Kayaku Co., Ltd., epoxy equivalent: 238 g/eq)
YX-4000: biphenyl epoxy resin ("YX-4000" manufactured by Mitsubishi Chemical Corporation, epoxy equivalent: 188 g/eq)
Curing agent TD-2131: phenol novolac resin ("TD-2131" manufactured by DIC Corporation, hydroxyl equivalent: 104 g/eq)
Curing agent Me-THPA: methyltetrahydrophthalic anhydride
Curing accelerator 1,2-DMZ: 1,2-dimethylimidazole
TPP: triphenylphosphine
Fused silica: spherical silica "FB-560" manufactured by Denki Kagaku Kabushiki Kaisha
Silane coupling agent: γ-glycidoxy triethoxyxysilane "KBM-403" manufactured by Shin-Etsu Chemical Co., Ltd.
Carnauba wax: "PEARL WAX No. 1-P" manufactured by Denki Kagaku Kabushiki Kaisha Next, a composition obtained by pulverizing the obtained resin composition was molded by a transfer molding machine to have a disk shape having a diameter of 50 mm×3 (t) mm at a pressure of 70 kg/cm$^2$ and a temperature of 175° C. for a time of 180 seconds, and further cured at 180° C. for 5 hours.

<Measurement of Glass Transition Temperature and Hot Elastic Modulus>

The produced formed product which is a cured product having a thickness of 0.8 mm was cut to have a size having a width of 5 mm and a length of 54 mm, and this was used as a test piece 1. The test piece 1 was measured using a viscoelasticity measurement device (DMA: solid viscoelasticity measurement device "RSA II" manufactured by Rheometrics, Inc., rectangular tension method: frequency of 1 Hz, heating rate of 3° C./min) such that a temperature at which an elastic modulus change is maximized (at which a rate of tan δ change is greatest) was obtained as a glass transition temperature, and a storage elastic modulus at 260° C. was obtained as hot elastic modulus.

<Measurement of Shrinkage during Molding>

Using a transfer molding machine (KTS-15-1.5C, manufactured by Kohtaki Precision Machine Co., Ltd.), the resin composition was injection molded under the conditions of a mold temperature of 150° C., a molding pressure of 9.8 MPa, and a curing time of 600 seconds, to produce a test piece having a height of 110 mm, a width of 12.7 mm, and a thickness of 1.6 mm. Thereafter, the test piece was post-cured at 175° C. for 5 hours, an inner diameter dimension of the mold cavity and an outer diameter dimension of the test piece at a room temperature (25° C.) were measured, and the shrinkage was calculated by the following equation.

Shrinkage (%)={(Inner diameter dimension of mold)−(Dimension in longitudinal direction of cured product at 25° C.)}/(Inner diameter dimension of the mold cavity at 175° C.)× 100(%)

The results thereof are shown in Table 1.

<Evaluation of Thermal Resistance>

The obtained curable composition was poured into a mold having a width of 90 mm, a length of 110 mm, and a height of 2 mm, cured at 75° C. for 2 hours, and then further cured for 3 hours at 120° C. The obtained cured product was cut to have a width of 5 mm and a length of 50 mm with a diamond cutter, and this was used as a test piece. Next, a dynamic viscoelasticity of the test piece was measured by double-end bending using a viscoelasticity measurement device ("DMS 6100" manufactured by Seiko Instruments Inc.), and evaluated such that a temperature at which the tan δ became maximum was obtained as the glass transition temperature Tg. For measurement conditions for dynamic viscoelasticity measurement, temperature condition was a room temperature to 260° C., temperature increase rate was 3° C./min, a frequency was 1 Hz, and a strain amplitude was 10 μm.

<Measurement of Bending Strength and Bending Elastic Modulus>

The obtained epoxy resin composition was poured into a mold having a width of 90 mm, a length of 110 mm, and a height of 4 mm, cured at 90° C. for 2 hours, and then further cured for 3 hours at 110° C. In accordance with JIS K6911, bending strength and bending elastic modulus of the cured product were measured.

<Evaluation of Volatility>

1 g of the epoxy resin was weighed in a metal petri dish and heated for 1 hour in a dryer at 125° C. or 150° C., and the volatile content was evaluated from the mass change before and after the heating.

TABLE 1

| | | Example 1 | Example 2 | Example 3 | Example 4 | Example 5 | Example 6 | Example 7 | Example 8 |
|---|---|---|---|---|---|---|---|---|---|
| Epoxy resin | A-1 | 126 | 12 | 12 | 13 | 14 | 13 | | |
| | A-2 | | | | | | | 148 | |
| | A-3 | | | | | | | | 120 |
| | N-655-EXP-S | | 113 | | | | | | |
| | N-770 | | | 111 | | | | | |

TABLE 1-continued

|  |  | Example 1 | Example 2 | Example 3 | Example 4 | Example 5 | Example 6 | Example 7 | Example 8 |
|---|---|---|---|---|---|---|---|---|---|
|  | HP-5000 |  |  |  | 121 |  |  |  |  |
|  | NC-3000 |  |  |  |  | 122 |  |  |  |
|  | NC-2000L |  |  |  |  |  | 118 |  |  |
| Curing agent | TD-2131 | 63 | 64 | 66 | 56 | 53 | 58 | 41 | 69 |
|  | TPP | 3 | 3 | 3 | 3 | 3 | 3 | 3 | 3 |
| Fused silica |  | 800 | 800 | 800 | 800 | 800 | 800 | 800 | 800 |
| Silane coupling agent |  | 3 | 3 | 3 | 3 | 3 | 3 | 3 | 3 |
| Carnauba wax |  | 2 | 2 | 2 | 2 | 2 | 2 | 2 | 2 |
| Carbon black |  | 3 | 3 | 3 | 3 | 3 | 3 | 3 | 3 |
| Measurement results |  |  |  |  |  |  |  |  |  |
| Glass transition temperature (° C.) |  | 95 | 150 | 175 | 133 | 138 | 140 | 92 | 98 |
| Elastic modulus at 260° C. (MPa) |  | 7 | 60 | 100 | 14 | 22 | 51 | 6 | 7 |
| Shrinkage during Molding (%) |  | 0.70 | 0.60 | 0.55 | 0.60 | 0.55 | 0.51 | 0.75 | 0.68 |

TABLE 2

|  |  | Comparative Example 1 | Comparative Example 2 | Comparative Example 3 | Comparative Example 4 | Comparative Example 5 |
|---|---|---|---|---|---|---|
| Epoxy resin | N-655-EXP-S | 125 |  |  |  |  |
|  | N-770 |  | 122 |  |  |  |
|  | HP-5000 |  |  | 134 |  |  |
|  | NC-3000 |  |  |  | 138 |  |
|  | NC-2000L |  |  |  |  | 132 |
| Curing agent | TD-2131 | 64 | 67 | 55 | 51 | 57 |
|  | TPP | 3 | 3 | 3 | 3 | 3 |
| Fused silica |  | 800 | 800 | 800 | 800 | 800 |
| Silane coupling agent |  | 3 | 3 | 3 | 3 | 3 |
| Carnauba wax |  | 2 | 2 | 2 | 2 | 2 |
| Carbon black |  | 3 | 3 | 3 | 3 | 3 |
| Measurement results |  |  |  |  |  |  |
| Glass transition temperature (° C.) |  | 163 | 189 | 140 | 145 | 148 |
| Elastic modulus at 260° C. (MPa) |  | 65 | 110 | 16 | 25 | 55 |
| Shrinkage during Molding (%) |  | 0.44 | 0.33 | 0.50 | 0.45 | 0.45 |

TABLE 3

|  |  | Example 9 | Example 10 | Example 11 | Comparative Example 6 |
|---|---|---|---|---|---|
| Epoxy resin | A-1 | 55.7 | — | — | — |
|  | A-3 | — | 51.9 | — | — |
|  | A-4 | — | — | 54.4 | — |
|  | A'-1 | — | — | — | 59.0 |
| Curing agent | Me-THPA | 44.3 | 48.1 | 45.6 | 41.0 |
| Curing accelerator | 1,2-DMZ | 1 | 1 | 1 | 1 |
| DMA Tg (° C.) |  | 110 | 126 | 123 | 95 |
| Bending strength | MPa | 95 | 107 | 100 | 47 |
| Bending elastic modulus | MPa | 3630 | 3570 | 3600 | 3750 |
| Bending strain | % | 2.8 | 3.2 | 3.0 | 0.4 |

TABLE 4

| Evaluation of volatility of resin |  |  |  |  |
|---|---|---|---|---|
|  |  | Viscosity 25° C. | 125° C. 1 hour | 150° C. 1 hour |
| Epoxy resin | A-1 | 1180 | 97.6 | 91.7 |
|  | A-3 | 680 | 98.1 | 94.1 |
|  | A-4 | 1500 | 97.9 | 93.1 |
|  | A'-1 | 2690 | 97.1 | 88.8 |
|  | A'-2 | 3560 | 98.5 | 95.9 |

Since the epoxy resin (A'-1) has a relatively high content ratio of the cyclic compound (β1), volatility of the resin is high, and it is not suitable for thermal curing at a high temperature. In addition, the mechanical strength or the thermal resistance of the cured product is also insufficient. On the other hand, the epoxy resin (A'-2) having a relatively low content ratio of the cyclic compound (β1) has no problem with regard to volatility. However, since a viscosity thereof at a room temperature (25° C.) is high, it is difficult to apply to a semiconductor encapsulating material which is required to mix filler or the like or a fiber-reinforced composite material for which an impregnation step of reinforcing fibers is essential.

The invention claimed is:

1. A method of producing an epoxy resin, comprising:
reacting epichlorohydrin with monoalkyl dihydroxybenzene that has an alkyl group having 4 to 8 carbon atoms as a substituent on an aromatic ring and dialkyl dihydroxybenzene that has two alkyl groups each having 4 to 8 carbon atoms as substituents on an aromatic ring such that the mass ratio of the monoalkyl dihydroxybenzene to the dialkyl dihydroxybenzene is in the range of 99.1/0.9 to 99.9/0.1.

2. The method of producing an epoxy resin according to claim 1,
wherein the monoalkyl dihydroxybenzene is monoalkyl catechol, and
the dialkyl dihydroxybenzene is dialkyl catechol.

* * * * *